United States Patent
Bergendahl et al.

(10) Patent No.: US 9,318,347 B2
(45) Date of Patent: Apr. 19, 2016

(54) WAFER BACKSIDE PARTICLE MITIGATION

(71) Applicant: International Business Machines Corporation, Armonk, NY (US)

(72) Inventors: Marc A. Bergendahl, Troy, NY (US); James J. Demarest, Rensselaer, NY (US); Alex R. Hubbard, East Greenbush, NY (US); Richard Johnson, Albany, NY (US); Ryan O. Jung, Rensselaer, NY (US); James J. Kelly, Schenectady, NY (US); Sanjay C. Mehta, Niskayuna, NY (US); Alexander Reznicek, Troy, NY (US); Allan W. Upham, Waterford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/459,745

(22) Filed: Aug. 14, 2014

(65) Prior Publication Data

US 2016/0049311 A1 Feb. 18, 2016

(51) Int. Cl.
*H01L 21/322* (2006.01)
*H01L 21/3105* (2006.01)
*H01L 21/02* (2006.01)

(52) U.S. Cl.
CPC ........ *H01L 21/322* (2013.01); *H01L 21/02532* (2013.01); *H01L 21/02592* (2013.01); *H01L 21/31055* (2013.01)

(58) Field of Classification Search
None
See application file for complete search history.

(56) References Cited

U.S. PATENT DOCUMENTS

| | | | |
|---|---|---|---|
| 6,413,321 B1 | 7/2002 | Kim et al. |
| 6,881,264 B2 | 4/2005 | Hiatt et al. |
| 6,884,717 B1 | 4/2005 | Desalvo et al. |
| 6,998,344 B2 | 2/2006 | Akram et al. |
| 7,056,812 B2 | 6/2006 | Derderian et al. |
| 7,098,152 B2 | 8/2006 | Moore |
| 7,446,045 B2 | 11/2008 | Matsumoto |
| 7,556,712 B2 | 7/2009 | Yi et al. |
| 7,781,343 B2 | 8/2010 | Letz et al. |
| 2003/0045131 A1 | 3/2003 | Verbeke et al. |
| 2004/0079385 A1 | 4/2004 | Frisa et al. |
| 2006/0124155 A1 | 6/2006 | Suuronen et al. |
| 2009/0212397 A1 | 8/2009 | Tuttle |
| 2013/0020682 A1 | 1/2013 | Clark et al. |
| 2013/0092186 A1 | 4/2013 | Lin et al. |

OTHER PUBLICATIONS

Prosecution history of related U.S. Appl. No. 14/459,809, Notice of Allowance dated Jul. 2, 2015, all pages.

*Primary Examiner* — Yasser A Abdelaziez
(74) *Attorney, Agent, or Firm* — Law Offices of Ira D. Blecker, P.C.

(57) ABSTRACT

A method of particle mitigation which includes obtaining a semiconductor wafer having a nonfunctional backside and a functional frontside on which semiconductor devices are formed by one or more lithography processes; coating the backside with a layer comprising silicon or amorphous carbon; planarizing the coated backside by a planarizing process; placing the semiconductor wafer onto a wafer chuck such that the wafer chuck makes direct contact with the coated backside; and while maintaining the coated backside in direct contact with the wafer chuck, performing a first lithographic process on the frontside.

19 Claims, 3 Drawing Sheets

WAFER BACKSIDE PARTICLE MITIGATION

RELATED APPLICATION

This application is related to U.S. patent application Ser. No. 14/459,809, entitled "WAFER BACKSIDE PARTICLE MITIGATION", filed even date herewith.

BACKGROUND

The present exemplary embodiments relate to mitigating particle contamination on the backside of a semiconductor wafer, and more particularly, relate to mitigating particle contamination by providing a coating on the backside of the semiconductor wafer to encapsulate the contaminating particles and fill any scratches.

Particulate matter may be generated from wafer handling devices (such as pics, pins and pads) as the semiconductor wafers travel through a multitude of tools in the line. Some particulate matter, and especially scratches and dents, are inevitable, regardless of any sort of preemptive cleaning or wiping methods.

The semiconductor wafers are typically handled with a so-called wafer chuck, one example of a wafer chuck being an electrostatic wafer chuck, which secures the semiconductor wafer during processing. However, conventional electrostatic chucks maintain a high percent point of contact with the backside of the semiconductor wafer. This large area of contact is highly susceptible to semiconductor wafer backside particulate manner and scratches, which can create wafer topography during lithography exposure and lead to "hot spots". A hot spot in the present context is a lithography term for a localized pattern distortion (i.e., defocus) of which one cause is wafer topography.

BRIEF SUMMARY

The various advantages and purposes of the exemplary embodiments as described above and hereafter are achieved by providing, according to a first aspect of the exemplary embodiments, a method of particle mitigation which includes obtaining a semiconductor wafer having a nonfunctional backside and a functional frontside on which semiconductor devices are formed by one or more lithography processes; coating the backside with a mitigating layer comprising silicon or amorphous carbon; planarizing the coated backside by a planarizing process; placing the semiconductor wafer onto a wafer chuck such that the wafer chuck makes direct contact with the coated backside; and while maintaining the coated backside in direct contact with the wafer chuck, performing a first lithographic process on the frontside.

According to a second aspect of the exemplary embodiments, there is provided a method of particle mitigation which includes obtaining a semiconductor wafer having a nonfunctional backside and a functional frontside on which semiconductor devices are formed by one or more lithography processes; coating the backside with a mitigating layer comprising silicon or amorphous carbon; planarizing the coated backside by a planarizing process; placing the semiconductor wafer onto an electrostatic wafer chuck such that the electrostatic wafer chuck makes direct contact with the coated backside; and while maintaining the coated backside in direct contact with the electrostatic wafer chuck, performing an extreme ultraviolet (EUV) lithographic process on the frontside.

According to a third aspect of the exemplary embodiments, there is provided a method of particle mitigation which includes obtaining a semiconductor wafer having a nonfunctional backside and a functional frontside on which semiconductor devices are formed by one or more lithography processes; coating the backside with a mitigating layer comprising silicon or a carbon-like material; planarizing the coated backside by a planarizing process; coating the mitigating layer with a stop layer that is compositionally different than the mitigating layer; coating the stop layer with another mitigating layer comprising silicon or carbon-like material; planarizing the coated backside by a planarizing process; repeating, a predetermined number of times, coating the mitigating layer with the stop layer that is compositionally different than the mitigating layer, coating the stop layer with another mitigating layer comprising silicon or amorphous carbon, and planarizing the coated backside by the planarizing process; placing the semiconductor wafer onto a wafer chuck such that the wafer chuck makes direct contact with the coated backside; and while maintaining the coated backside in direct contact with the wafer chuck, performing a lithographic process on the frontside.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 2 to 4 illustrate a first exemplary process of particle mitigation in which:

FIG. 2 is a cross sectional view of FIG. 1 showing a backside coating on the semiconductor wafer;

FIG. 3 is a cross sectional view illustrating the semiconductor wafer of FIG. 2 in which the backside coating is planarized; and FIG. 4 is a cross sectional view illustrating the semiconductor wafer of FIG. 3 being placed on an electrostatic chuck and a lithography process being performed on the frontside of the semiconductor wafer.

FIGS. 5 to 7 illustrate a second exemplary process of particle mitigation in which:

FIG. 5 is a cross sectional view illustrating a protective coating formed on the frontside of the semiconductor wafer;

FIG. 6 is a cross sectional view illustrating a backside coating on the semiconductor wafer of FIG. 5; and FIG. 7 is a cross sectional view illustrating the semiconductor wafer of FIG. 6 in which the backside coating is planarized.

DETAILED DESCRIPTION

Semiconductor technology is well known. Through semiconductor fabrication processes, semiconductor devices are formed on a semiconductor wafer. A typical semiconductor wafer has a back, nonfunctional side (hereafter "backside") and a front, functional side (hereafter "frontside"). The semiconductor fabrication processes such as front end of the line processes to form transistors and back end of the line processes to form interconnects occur on the frontside of the semiconductor wafer. Lithography may be used in many of these semiconductor fabrication processes to pattern the frontside. Optical lithography, immersion lithography, ultraviolet (UV) lithography and extreme ultraviolet (EUV) lithography being examples of types of lithographic processes that may be utilized.

During these semiconductor fabrication processes, the semiconductor wafer may be supported by a wafer chuck such as an electrostatic wafer chuck. Electrostatic wafer chucks employ a platen with integral electrodes which are biased with high voltage to establish an electrostatic holding force between the platen and wafer, thereby "chucking" the wafer. The semiconductor wafer is typically placed backside down on the wafer chuck since the backside has no semiconductor devices and is thus nonfunctional.

As noted previously, particulate matter and scratches on the backside can cause problems such as lithographic "hotspots" and so it is desirable to mitigate the harmful effect of such particulate matter and scratches.

Figure 1:
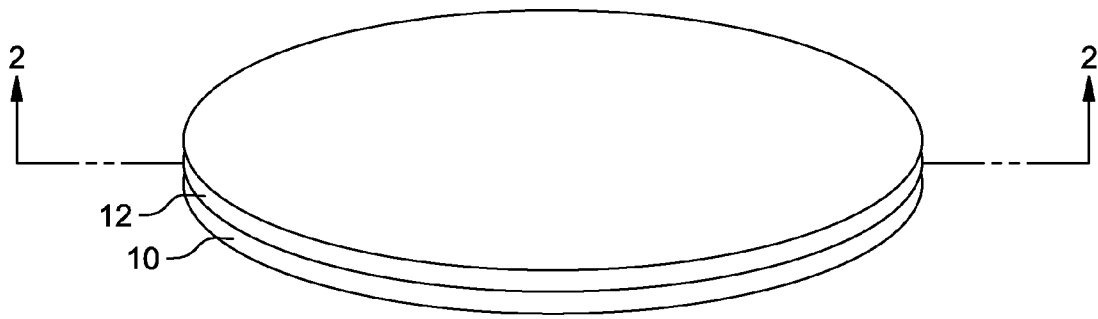
FIG. 1 is a perspective view of a semiconductor wafer according to the exemplary embodiments having a coating on the backside of the semiconductor wafer.

Referring to the Figures in more detail, and particularly referring to FIG. 1, there is illustrated a semiconductor wafer 10 having a coating 12 on the backside of the semiconductor wafer. The coating 12 may also be referred to as a mitigating layer.

It may be desirable to have the semiconductor 10 undergo a cleaning process prior to applying the coating 12 in order to remove as many particulate matter as possible. This cleaning process may be a conventional cleaning process such as a wet cleaning process or a dry cleaning process where the wafer may be wiped to remove the particulate matter. It is believed that in many cases, encapsulation by applying the coating 12 may be desirable since there may be incomplete removal of the particulate matter during any cleaning process and in any case, scratches may not be removed by cleaning. In one exemplary embodiment, the particulate matter and scratches may be characterized before applying the coating 12 to determine if the coating 12 is desirable.

Figure 2:
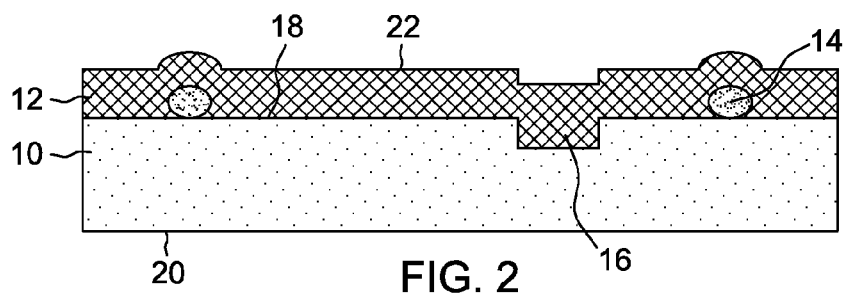

FIG. 2 is a cross sectional view of FIG. 1 in the direction of arrows 2-2 shown in FIG. 1. Semiconductor wafer 10 may have particulate matter 14 and/or scratches 16 on the backside 18 of the semiconductor wafer 10. The frontside of the semiconductor wafer is indicated by reference number 20.

Figure 3:
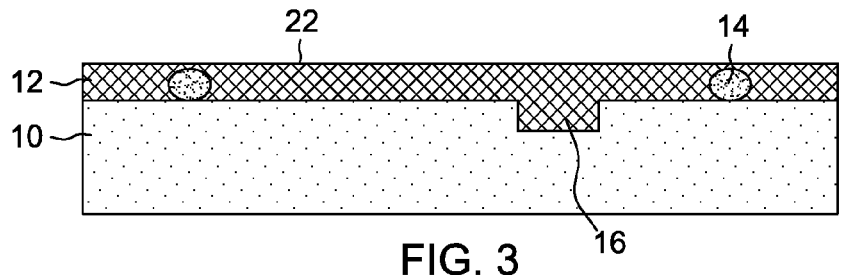

A coating 12 has been applied to the backside 18 so as to encapsulate the particulate matter 14 and fill scratches 16 that may be present on the backside 18. Coating 12 may have a thickness that may be selected to be on the order of at least about two times the size of the maximum targeted particle size. For example, typical particle sizes range from 0-10 um so the layer thickness may be on the order of 20 um. The coating 12 may be deposited or applied by a spin on film process. In one exemplary embodiment the coating 12 may be silicon, such as amorphous silicon. In an alternative embodiment, the coating 12 may be an amorphous carbon film. Both of the silicon and amorphous carbon films may be planarized and may also be removed selectively using a wet process or a dry process such as a reactive ion etching process or some combination thereof. In one exemplary embodiment, TEOS (tetraethyl orthosilicate) for the silicon film or acetylene, ethylene or propylene for the amorphous carbon film may be applied by a spin on process at a temperature that is compatible with any frontside films, for example, 250 to 600° C. to turn the spin on film into silicon or amorphous carbon. For backside deposition, the processing should be performed in a single wafer chamber. It is noted that the surface 22 of the coating 12 may be uneven due to the presence of particulate matter 14 and scratch 16. Accordingly, the coating 12 may undergo a planarizing process to planarize the surface 22 of the coating 12. For purposes of illustration and not limitation, the planarizing process may be a chemical-mechanical planarizing process (CMP). The coating 12 after planarization is shown in FIG. 3.

Figure 4:
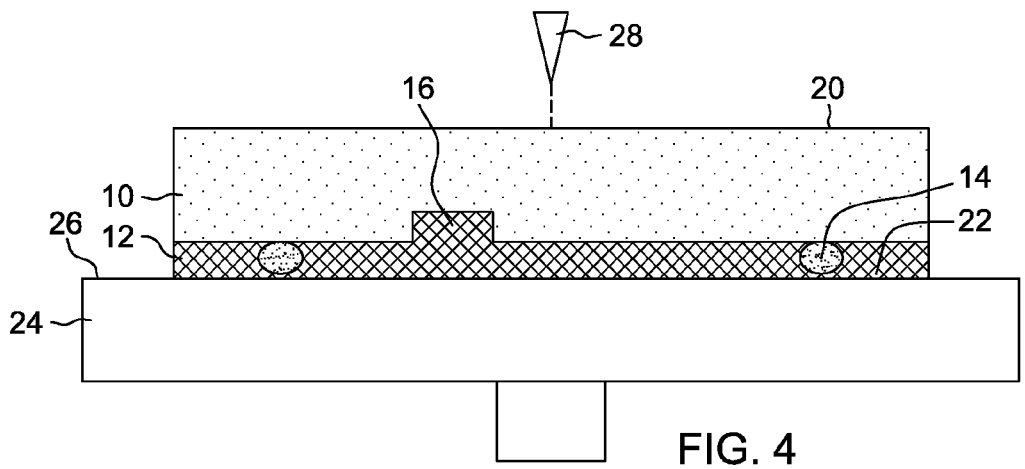

Referring now to FIG. 4, the semiconductor wafer 10 is flipped over so as to be supported on a wafer chuck 24, such as an electrostatic chuck. Frontside surface 20 (now facing up) of the semiconductor wafer 10 may then undergo a lithographic process such as by lithographic tool 28. Most preferably, the lithographic process is an EUV process in which extreme ultraviolet light (around 13.5 nanometers in wavelength) is used for exposing a photoresist. Surface 22 of coating 12 is now in direct contact with surface 26 of wafer chuck 24. It is noted that since the particulate matter 14 and scratch 16 are fully encapsulated by coating 12, and there is even topography due to the planarizing described with respect to FIG. 3, the semiconductor wafer 10 may be processed without fear of hotspots.

Later in the process flow, the coating 12 may be removed by conventional means such as by reactive ion etching, wet etching or chemical-mechanical polishing, depending on the specific film chosen.

Figure 5:
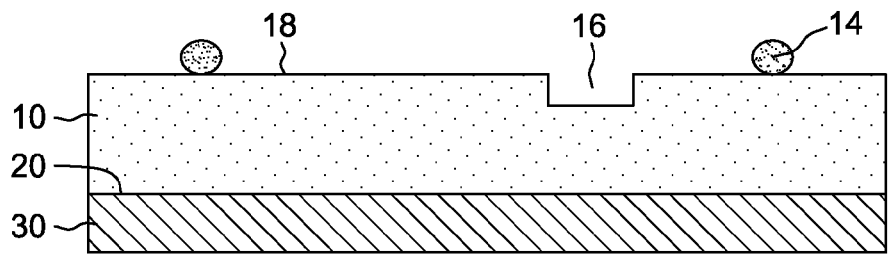
Figure 6:
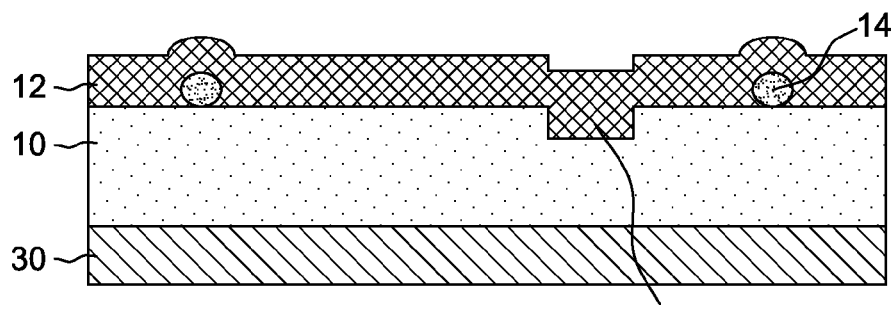
Figure 7:
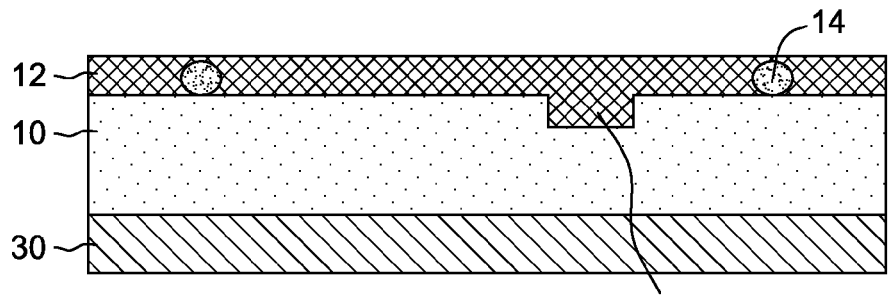

Referring now to FIGS. 5 to 7, another exemplary embodiment will be described. In this exemplary embodiment, a protective coating 30 may be applied to the frontside 20 of the semiconductor wafer 10 to avoid any possible harm to the frontside 20 when the backside coating 12 is applied. In a preferred exemplary embodiment, a protective coating may not be required, but if it is required (for instance when the exposed frontside cannot be mechanically contacted to the wafer chuck without damaging the frontside film stack), then the protective coating 30 may need to be applied, and the material for such protective coating may need to be chosen with special consideration with respect to the choice of backside pattern material as chosen above, so as to allow selective removal in subsequent processes. The protective coating 30 may also be silicon or amorphous carbon. The protective coating 30 may be the same or different than the backside coating 12.

As shown in FIG. 5, protective coating 30 has been applied to the frontside 20 of the semiconductor wafer 10. The backside 18 may contain particulate matter 14 and/or scratch 16 which may need to be encapsulated.

Coating 12 may be applied as described previously to the backside 18 to encapsulate the particulate matter 14 and fill scratch 16, as shown in FIG. 6, followed by planarizing to result in the structure shown in FIG. 7.

Figure 8:
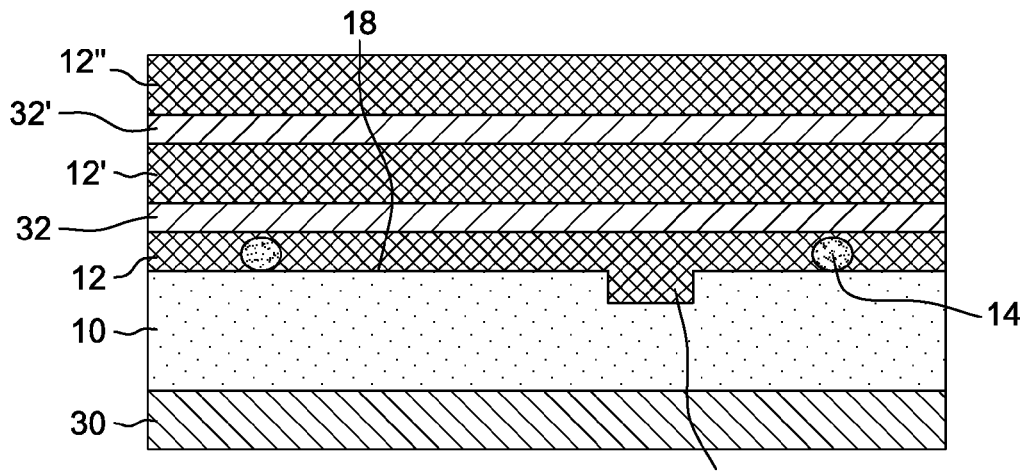
FIG. 8 illustrates a third exemplary embodiment of particle mitigation in which the backside of the semiconductor wafer of FIG. 7 is coated with a plurality of layers.

Another exemplary embodiment is illustrated in FIG. 8. In the exemplary embodiment illustrated in FIG. 8, multiple layers of coating 12 may be applied to the backside 18. The coating 12 may be applied and planarized, as described previously, to encapsulate the particulate matter 14 and fill scratch 16. Thereafter, a stop layer 32 such as an oxide may be applied to the coating 12 and planarized. Stop layer 32 may have a thickness of about 20 to 100 nm. The stop layer 32 provides a method of removing the exposed coated layer selective to another coated layer deeper in the stack. The stop layer 32 stops the removal of one coated layer selective to the stop layer. Any material that is compatible with being deposited alternately with the coating 12 as well as providing a selective stop against the coating 12 may be used as the stop layer 32. For example, if the coating 12 is silicon, then the stop layer 32 may be an oxide or nitride if the removal process of the silicon is reactive ion etching. If using a wet etching process, hot ammonia will etch silicon selective to oxide, for example. Then the stop layer 32 may be removed by a process selective to the underlying coating 12. For example, if the coating 12 is silicon and the stop layer 32 is oxide, then the oxide stop layer 32 may be removed, for example, by a fluorine-based reactive ion etching process or dilute HF.

Then another coating 12' may be applied to the stop layer 32 and planarized. This process sequence may be repeated until subsequent stop layer 32' and coating 12" have been formed as shown in FIG. 8. Additional stop layers and coatings may be applied until the desired number of stop layers and coatings have been added. All of the stop layers 32, 32' may comprise the same material or different materials. Similarly, all of the coatings 12, 12', 12" may comprise the same material or different materials.

The method of alternating coated layers separated by stop layers provides a stack of "pre-built" films that may be iteratively removed as needed, without the need to go through as many iterative deposition steps. That is, the last coating 12, 12' or 12" may be removed followed by removal of the last stop layer 32' or 32 so that the next coating 12 or 12' is a clean and flat backside layer for the next lithographic process, such as an EUV process. There may be cases where one is prohibited from depositing such a coated layer prior to EUV exposure due to exposed films, etc. where having several "pre-built" layers can serve the needed purpose of having a clean and flat backside layer before each lithographic process.

The frontside protective coating 30, while shown in FIG. 8, is optional and may be dispensed with if desired.

Figure 9:
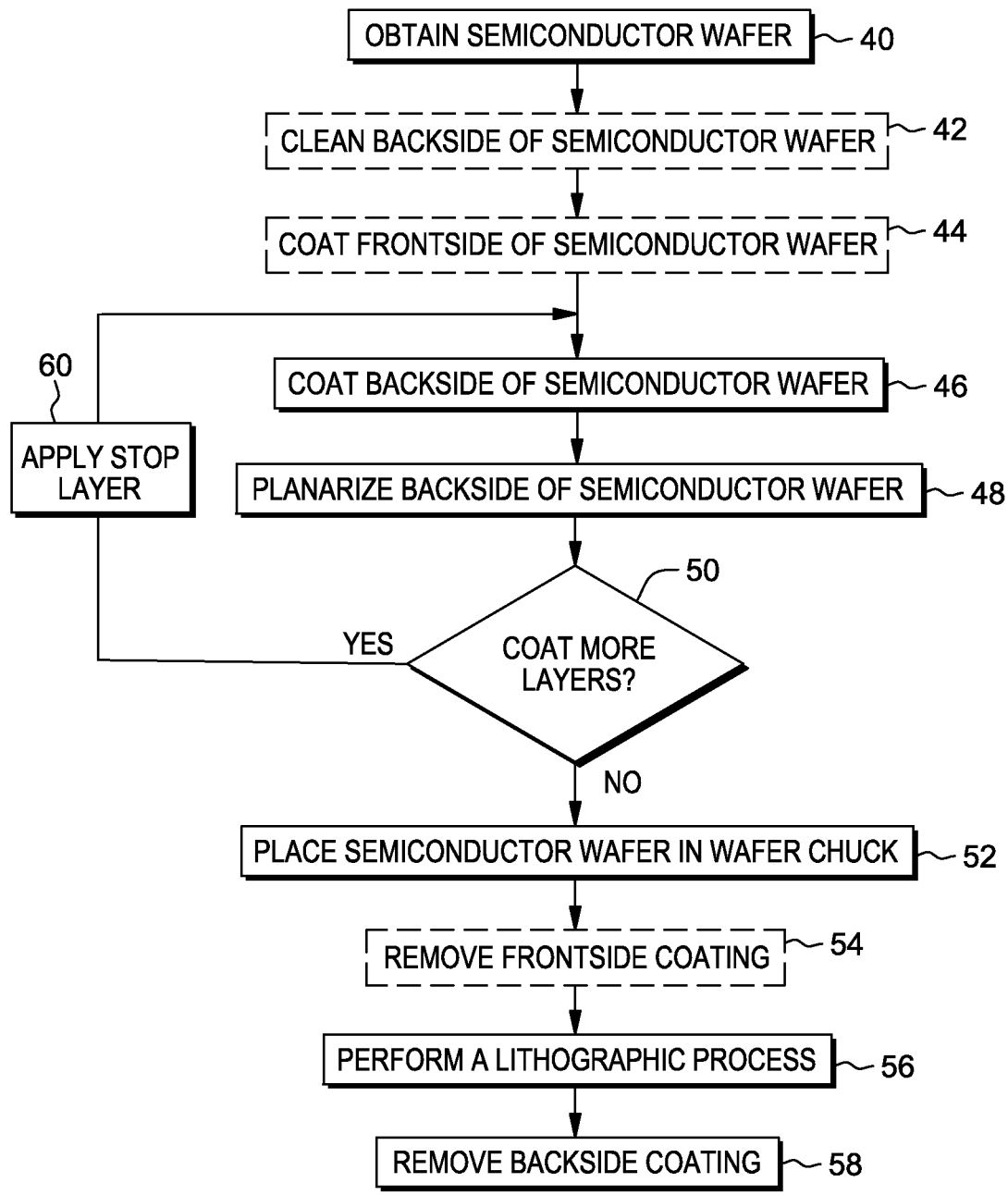
FIG. 9 is a flow chart illustrating a process for forming the exemplary embodiments.

Referring now to FIG. 9, there is illustrated a process flow for the various exemplary embodiments. The process begins by obtaining a semiconductor wafer, box 40.

In an optional process, the backside of the semiconductor wafer may be cleaned to remove as many particulate matter as possible, box 42. Optionally also, the backside of the semiconductor wafer may be characterized to determine if an encapsulating coating is desirable.

In another optional process, the frontside of the semiconductor wafer may receive a protective coating to protect the frontside during subsequent application of the backside coating, box 44. The frontside protective coating would have to be removed prior to performing any lithographic process on the frontside.

The backside of the semiconductor wafer may be coated, box 46, by any of the processes and materials described previously.

The backside coating may then be planarized, box 48.

It is then determined if more backside layers are to be applied, box 50. The additional backside layers may be those described with respect to FIG. 8. If more layers are to be applied, a stop layer may be applied such as stop layer 32 in FIG. 8, box 60, then the process returns to box 46 to apply additional coating layers. If no more layers are to be applied, the process proceeds to place the coated semiconductor wafer on the wafer chuck, box 52. It is preferred that the wafer chuck be an electrostatic wafer chuck. The backside coating is placed in direct contact on the wafer chuck.

If the semiconductor wafer has a frontside protective coating, the frontside coating may be removed, box 54, before or after the semiconductor wafer is placed on the wafer chuck. In any event, the frontside protective coating must be removed before a lithographic process is performed.

A lithographic process is next performed on the frontside, box 56. It is most preferred that the backside coating be present when the semiconductor wafer undergoes an EUV process as this process most likely leads to hotspots.

When lithographic processing is completed, or at least when EUV lithographic processing is completed, the backside coating may be removed, box 58.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of particle mitigation comprising:
    obtaining a semiconductor wafer having a nonfunctional backside and a functional frontside on which semiconductor devices are formed by one or more lithography processes;
    coating the backside with a mitigating layer comprising silicon or amorphous carbon;
    planarizing the coated backside by a planarizing process;
    placing the semiconductor wafer onto a wafer chuck such that the wafer chuck makes direct contact with the coated backside; and
    while maintaining the coated backside in direct contact with the wafer chuck, performing a first lithographic process on the frontside, wherein the mitigating layer encapsulates particulate matter and fills in scratches on the backside.

2. The method of claim 1 further comprising cleaning the backside by a cleaning process prior to coating the backside.

3. The method of claim 1 wherein the planarizing process is chemical mechanical polishing.

4. The method of claim 1 wherein the first lithographic process is an extreme ultraviolet (EUV) lithographic process and the wafer chuck is an electrostatic wafer chuck.

5. The method of claim 1 wherein the mitigating layer is amorphous silicon.

6. The method of claim 1 further comprising removing the mitigating layer subsequent to performing the first lithographic process.

7. A method of particle mitigation comprising:
    obtaining a semiconductor wafer having a nonfunctional backside and a functional frontside on which semiconductor devices are formed by one or more lithography processes;
    coating the backside with a mitigating layer comprising silicon or amorphous carbon;
    planarizing the coated backside by a planarizing process;
    placing the semiconductor wafer onto a wafer chuck such that the wafer chuck makes direct contact with the coated backside;
    while maintaining the coated backside in direct contact with the wafer chuck, performing a first lithographic process on the frontside; and
    further comprising, between planarizing the coated backside and placing the semiconductor wafer onto the wafer chuck, coating the coated backside with a stop layer that is compositionally different than the mitigating layer, coating the stop layer with another mitigating layer comprising silicon or amorphous carbon and planarizing the another mitigating layer by a second planarizing process.

8. The method of claim 7 further comprising removing the another mitigating layer and the stop layer subsequent to performing the first lithographic process;

while maintaining the coated and patterned backside in direct contact with the wafer chuck, performing a second lithographic process on the frontside; and removing the coated backside mitigating layer subsequent to performing the second lithographic process so as to expose the semiconductor wafer.

9. The method of claim 7 further comprising repeating, at least one additional time, coating the backside with the stop layer, coating the stop layer with the another mitigating layer comprising silicon or amorphous carbon and planarizing the another mitigating layer by the second planarizing process.

10. The method of claim 1 further comprising coating the frontside with a protective layer.

11. A method of particle mitigation comprising:
obtaining a semiconductor wafer having a nonfunctional backside and a functional frontside on which semiconductor devices are formed by one or more lithography processes;
coating the backside with a mitigating layer comprising silicon or amorphous carbon;
planarizing the coated backside by a planarizing process;
placing the semiconductor wafer onto a wafer chuck such that the wafer chuck makes direct contact with the coated backside;
while maintaining the coated backside in direct contact with the wafer chuck, performing a first lithographic process on the frontside;
further comprising coating the frontside with a protective layer; and
further comprising removing the frontside coating prior to performing the first lithographic process.

12. A method of particle mitigation comprising:
obtaining a semiconductor wafer having a nonfunctional backside and a functional frontside on which semiconductor devices are formed by one or more lithography processes;
coating the backside with a mitigating layer comprising silicon or amorphous carbon material;
planarizing the coated backside by a planarizing process;
placing the semiconductor wafer onto an electrostatic wafer chuck such that the electrostatic wafer chuck makes direct contact with the coated backside; and
while maintaining the coated backside in direct contact with the electrostatic wafer chuck, performing an extreme ultraviolet (EUV) lithographic process on the frontside;
wherein the mitigating layer encapsulates particulate matter and fills in scratches on the backside.

13. The method of claim 12 wherein the mitigating layer is amorphous silicon.

14. The method of claim 12 further comprising removing the mitigating layer subsequent to performing the lithographic process.

15. The method of claim 12 further comprising coating the frontside with a protective layer.

16. A method of particle mitigation comprising:
obtaining a semiconductor wafer having a nonfunctional backside and a functional frontside on which semiconductor devices are formed by one or more lithography processes;
coating the backside with a mitigating layer comprising silicon or amorphous carbon material;
planarizing the coated backside by a planarizing process;
placing the semiconductor wafer onto an electrostatic wafer chuck such that the electrostatic wafer chuck makes direct contact with the coated backside;
while maintaining the coated backside in direct contact with the electrostatic wafer chuck, performing an extreme ultraviolet (EUV) lithographic process on the frontside;
further comprising coating the frontside with a protective layer; and
further comprising removing the frontside coating prior to performing the lithographic process.

17. A method of particle mitigation comprising:
obtaining a semiconductor wafer having a nonfunctional backside and a functional frontside on which semiconductor devices are formed by one or more lithography processes;
coating the backside with a mitigating layer comprising silicon or amorphous carbon material;
planarizing the coated backside by a planarizing process;
coating the mitigating layer with a stop layer that is compositionally different than the mitigating layer;
coating the stop layer with another mitigating layer comprising silicon or amorphous carbon material;
planarizing the coated backside by the planarizing process;
repeating, a predetermined number of times, coating the another mitigating layer with the stop layer, coating the stop layer with a next another mitigating layer comprising silicon or amorphous carbon, and planarizing the coated backside by the planarizing process;
placing the semiconductor wafer onto a wafer chuck such that the wafer chuck makes direct contact with the coated backside; and
while maintaining the coated backside in direct contact with the wafer chuck, performing a lithographic process on the frontside.

18. The method of claim 17 wherein after performing the first lithographic process, further comprising:
removing the next another mitigating layer;
removing the stop layer directly adjacent to the next another mitigating layer so as to expose the next another mitigating layer, the another mitigating layer or the first mitigating layer, as the case may be;
placing the semiconductor wafer onto a wafer chuck such that the wafer chuck makes direct contact with the next another mitigating layer, the another mitigating layer or the first mitigating layer, as the case may be;
while maintaining the coated and patterned backside in direct contact with the wafer chuck, performing a second lithographic process on the frontside; and
subsequent to performing the second lithographic process, removing all of the next another mitigating layer, the another mitigating layer and the first mitigating layer so as to expose the semiconductor wafer.

19. The method of claim 17 further comprising coating the frontside with a protective layer.

* * * * *